United States Patent [19]

Nakamura et al.

[11] Patent Number: 5,106,433
[45] Date of Patent: Apr. 21, 1992

[54] HEAT-CONDUCTIVE COMPOSITE MATERIAL

[75] Inventors: Yasuyuki Nakamura; Kenji Hirano, both of Suita, Japan

[73] Assignee: Sumitomo Special Metal Co., Ltd., Osaka, Japan

[21] Appl. No.: 557,086

[22] Filed: Jul. 25, 1990

Related U.S. Application Data

[62] Division of Ser. No. 503,997, Apr. 4, 1990.

[30] Foreign Application Priority Data

Dec. 12, 1989 [JP] Japan .................................. 1-323283

[51] Int. Cl.⁵ ...................... C21D 1/00; H01L 23/02; B32B 15/20
[52] U.S. Cl. .................. 148/11.5 Q; 357/81; 428/614; 428/620; 428/663; 428/674; 428/675; 428/676; 428/931
[58] Field of Search .................. 148/11.5 Q, 614, 620, 148/663, 665, 674, 931, 675, 676; 357/81

[56] References Cited

U.S. PATENT DOCUMENTS 4,283,464 8/1981 Hascoe .................................. 428/614

Primary Examiner—R. Dean
Assistant Examiner—Robert R. Koehler
Attorney, Agent, or Firm—Watson, Cole, Grindle & Watson

[57] ABSTRACT

A heat-conductive composite material usable as a substrate (heat sink) for mounting a semiconductor thereon or a lead frame is provided, which comprises a core sheet and metal foil layers as welded to the both surfaces of the core sheet. The core sheet is composed of a metal sheet of high thermal expansion as sandwiched between two metal sheets of low thermal expansion each having a number of through-holes in the direction of the thickness, and the three layers are laminated and integrated so that a part of the metal sheet of high thermal expansion is exposed out to the metal surfaces of low thermal expansion through the through-holes of the metal sheets of low thermal expansion. The metal foil layers each are made of a metal of high thermal expansion, which are same as or different from the metal of high thermal expansion of constituting the core sheet. Varying the thickness ratio of the respective constitutional metal sheets and the surface area ratio of the exposed metal spots on the surfaces of the core sheet, heat-conductive composite materials having any desired thermal expansion coefficient and thermal conductivity can be obtained. Additionally, by providing the outermost metal foil layers on the both surfaces of the core sheet, the heat-conductive composite material has an improved uniform heat-receiving effect and an improved excellent heat-diffusing effect. Further, the material is free from fine pores on the both surfaces thereof and therefore has an excellent weldability.

14 Claims, 6 Drawing Sheets

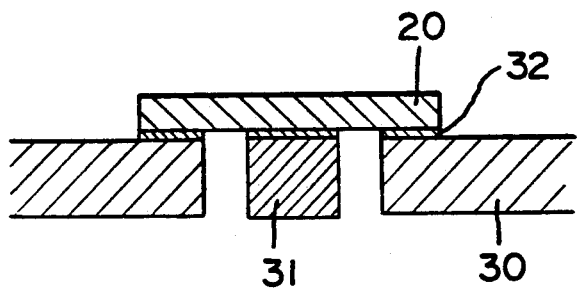
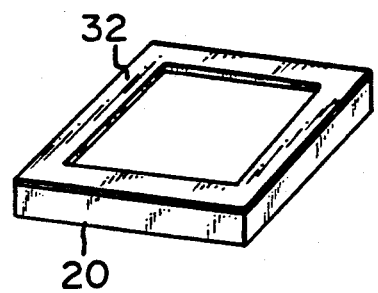
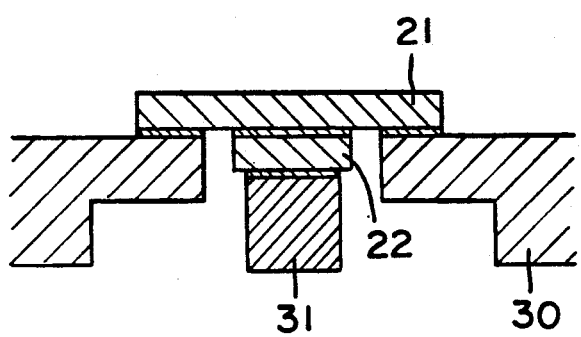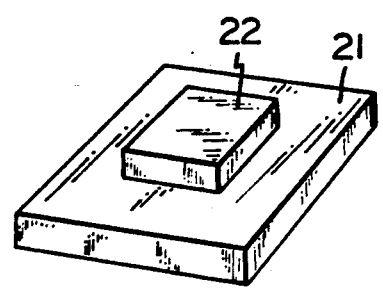
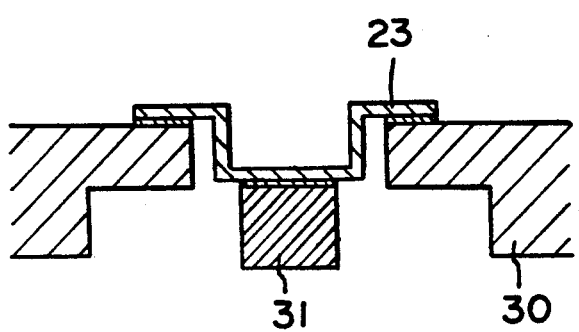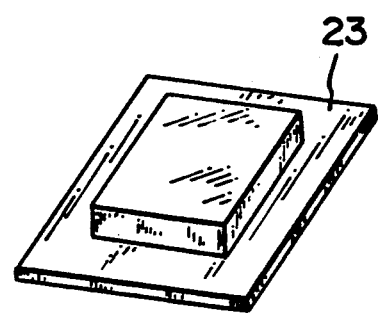

HEAT-CONDUCTIVE COMPOSITE MATERIAL

This application is a divisional application of application Ser. No. 503,997, filed Apr. 4, 1990.

BACKGROUND OF THE INVENTION

1. Field of the Invention

The present invention relates to heat-conductive composite material which is particularly adapted for use in the manufacture of a substrate (heat sink) for mounting a semiconductor chip thereon or a lead frame in semiconductor packages.

2. Description of the Prior Art

Recently, integrated circuit chips (hereinafter referred to as "chips") of semiconductor packages, especially those in LSI or ULSI for large-scaled (super) computers, have been directed toward elevation of the integrated degree and acceleration of the operation speed, and therefore the quantity of heat generated by the operation of the devices has become extremely large due to an increase electric power consumed.

That is, the capacity of the chips has become large-scaled and the quantity of heat generated during the operation has also become large. Accordingly, if the thermal expansion coefficient of the substrate material is significantly different from that of the material of the chip of silicon or gallium arsenide, the chip will peel off from the substrate or be broken.

For this reason, heat-diffusibility has to be taken into consideration in planning the semiconductor package, and therefore the substrate to which the chip is mounted must also have a proper heat-diffusibility. Accordingly, the substrate material is required to have a large thermal conductivity.

Specifically, the substrate material is required to have a large thermal expansion coefficient which is near to that of the chip to be mounted thereon and also to have a large thermal conductivity. Hitherto, semiconductor packages of various constructions have been proposed. For example, the constructions shown in FIGS. 9-a and 9-b are known.

FIG. 9-a is referred to, where Mo material (2) having a thermal expansion coefficient which is near to that of chip (1) is brazed and laminated with Kovar alloy material (4) having a thermal expansion coefficient which is near to that of alumina material (3) constituting the package substrate, a chip is mounted on the Mo material (2), the chip is connected to the package substrate via the Kovar alloy material (4) and heat-release fin (5) is attached to the material (4).

In the noted construction, although the danger of peeling or cracking is little because the alumina material (3) and the Kovar alloy material (4) each have a similar thermal expansion coefficient; however, an insufficient heat-releasability is achieved even with the heat-release fin (5) since the material to control the heat-releasibility is the Kovar alloy material (4), which has a low thermal conductivity.

For this reason, clad boards as well as composite materials for heat sinks, such as Cu—Mo or Cu—W alloy, have been proposed as materials capable of satisfying the antinomic requirements of having a conformity with the thermal expansion coefficient of chips while having a large thermal conductivity.

As a clad board for a heat sink, a laminate material comprising a copper sheet and Invar alloy (Co—Ni—Fe or Ni—Fe) sheet is used.

Precisely, copper has a large thermal expansion coefficient though having a good thermal conductivity, and in order to depress such high thermal expansion coefficient, Invar alloy is laminated to the copper under pressure in the construction of the clad board, whereby the longitudinal thermal expansion of the board is made conformable to the chip to be mounted thereon. Where Invar alloy sheets are laminated on both surfaces of the copper sheet under pressure to give a sandwich structure, warping by temperature elevation may be prevented.

Although the clad board of this type could have the same thermal expansion coefficient as the chip to be mounted thereon, the thermal conductivity of the board in the thickness direction is not always sufficient since it has Invar alloy like the constitution of FIG. 9-a.

A chip support has been proposed, where punching metals of Ni—Fe having a thermal expansion coefficient which is near to that of the chip to be mounted on the support have been embedded into the chip-carrying surface of the support such as Cu (Japanese Patent Publication No. 58-46073).

However, since the support has the construction where the punching metals have been embedded into one surface of the support, there is a problem of warping by the bimetal effect.

A heat-release chip support has also been proposed, where a grid of Ni—Fe having a thermal expansion coefficient which is near to that of the chip to be mounted on the support has been embedded and laminated to the chip-carrying support such as Cu (U.S. Pat. No. 3,399,332).

However, there is a danger of introducing gases or dust into the support in the manufacture thereof so that the support would swell when heated. In addition, since the support has the thermal expansion-adjusting Ni—Fe grid in the center part of the thickness of the support such as Cu, it is necessary that the thickness of the support of Cu be thin in order that the thermal expansion coefficient of the surface of the support is similar to that of the grid. In such a construction, however, the thermal transmission in the direction parallel to the surface of the support would be fairly bad, though it might be good in the direction of the thickness thereof.

A heat-conductive metal plate has also been proposed, where Cu or Al is placed between a pair of Co—Ni—Fe or Ni—Fe sheets each having a thermal expansion coefficient which is similar to that of the heat source having plural through-holes and is filled into the through-holes (Japanese Patent Publication No. 63-3741).

However, where the heat-conductive metal plate of the kind is worked or machined, there would be a danger of peeling. Additionally, where the surface of the plate is coated with Ni-plate coat so that it may be brazable, the Ni-plate coat would react with the copper to cause unevenness of the Ni-plate coat or gases or dust would be introduced into the interface between the Ni-plate coat and the surface of the metal plate to cause swelling of the metal plate when heated.

In the construction of the heat-conductive metal plate of the noted kind, the heat from the heat-generating source would differ from each other between the case where Cu is the subbing layer and the case where Co—Ni—Fe or Ni—Fe sheet is the subbing layer from the local viewpoint. Precisely, there is a problem that the heat on the Co—Ni—Fe or Ni—Fe sheet would often remain thereon and therefore the metal plate could not receive the heat uniformly.

On the other hand, Cu—Mo or Cu—W alloy substrate is made of a composite of Cu and Mo or W, which is prepared by sintering an Mo or W powder having a nearly same thermal expansion coefficient as the chip to be mounted on the support to give a sintered sheet having a large porosity and then applying a fused copper thereto (Japanese Patent Application Laid-Open No. 59-141247) or is prepared by sintering an Mo or W powder and a copper powder (Japanese Patent Application Laid-Open No. 62-294147).

The construction of the composite substrate of the kind, which is applied to a semiconductor package, is shown in FIG. 9-$b$, where the composite substrate (6) has flange (7) to be connected with alumina material (3) to constitute the package on the opposite side to the surface on which chip (1) is to be mounted and heat release is effected from the flange part.

Although this composite material has practically satisfactory characteristics with respect to thermal expansion coefficient and thermal conductivity, it must be machined for slicing so as to obtain the determined dimension as Mo and W each have a high density and are heavy. Such machinery working is expensive and the yield is poor.

In addition to the above-mentioned heat sink substrate, a lead frame is also required to have an improved conformity of the thermal expansion coefficient with the opposite part to be welded thereto and have an improved thermal conductivity.

In the construction of the resin-sealed semiconductor package as shown in FIG. 10, the lead frame is not only to be an electrically connecting line to the outer part but also to have an important role as a line for releasing the heat generated from the chip.

Precisely, in the semiconductor package, chip ($8_4$) is mounted on island ($8_1$) formed in the center part of lead frame ($8_0$) and is fixed thereon with a brazing material, adhesive or solder, while it is electrically connected with stitch ($8_2$) (inner lead) via bonding wire ($8_5$) and is sealed with resin ($8_6$) there around.

The heat to be generated from the chip ($8_4$) reaches lead ($8_3$) of the lead frame ($8_0$) via island ($8_1$), resin ($8_6$) and stitch ($8_2$) in order and is then released outwards.

Accordingly, the lead frame ($8_0$) is desired to be made of a material having a high thermal conductivity as it may well release the heat generated from the chip to the outward.

On the other hand, peeling of chip ($8_4$) from island ($8_1$) occurring in the adhering interface therebetween and cracking in resin ($8_6$) would be caused by the difference of the thermal expansion coefficient between the chip ($8_4$), the sealant resin ($8_6$) and the lead frame ($8_0$). In order to prevent such peeling or cracking, the conformity of the thermal expansion coefficient is indispensable between the said chip ($8_4$), resin ($8_6$) and lead frame ($8_0$).

As mentioned above, as the lead frame for the plastic semiconductor package, those which are made of a copper alloy having a good thermal conductivity have heretofore been employed in many cases in view of the good heat-releasability of the alloy.

However, in the field of requiring high reliability, copper alloys are not preferred, since they have a low mechanical strength and have a poor conformity with chips with respect to the thermal expansion coefficients therebetween and therefore there would be a danger of peeling of chip from island in the welded interface therebetween. For this reason, a semiconductor package made of an Ni—Fe alloy having a low thermal expansion coefficient, such as 42% Ni—Fe alloy, has been proposed in view of the conformity of the thermal expansion coefficient of the alloys with chips.

However, as Ni—Fe type allows have a poor thermal conductivity, the lead frame made of such alloys could not have a heat-releasability enough to satisfy the current requirement. In addition, the difference of thermal expansion between the chip and sealant resin is extremely large. Accordingly, even if the conformity of the thermal expansion coefficient is satisfactory between the lead frame and the chip, the conformity between the lead frame and the resin is poor so that it is difficult to completely prevent cracking of the sealant resin.

In ceramic semiconductor packages the lead frame is made of an Ni—Fe type alloy and is equipped with Al in the sealing position thereof in many cases, since the packages are sealed with glass. However, the Ni—Fe type alloys have a poor heat-releasability, as mentioned above, there is a problem on the conformity with ceramics with respect to the thermal expansion coefficient therebetween.

SUMMARY OF THE INVENTION

One object of the present invention is to provide a heat-conductive composite material which may have any desired thermal expansion coefficient and thermal conductivity to be properly selected in accordance with the use and object. For instance, the thermal expansion coefficient of the composite material is so selected as to be well conformable with the opposite material to be welded thereto, such as chip or sealant resin, while the composite problem on the heat-releasability from semiconductor packages.

Another object of the present invention is to provide a heat-conductive composite material which has a controllable thermal expansion coefficient and thermal conductivity in mounting a semiconductor chip thereon whereby receipt of heat by the material is uniformalized and the heat-diffusing effect of the material is improved. The composite material having such characteristics additionally has an excellent weldability with a thin film of a plate coat or brazing material, as the surface of the material is free from fine pores.

Still another object of the present invention is to provide a heat-conductive composite material which has excellent workability and manufacturability in practical operation and can be prepared inexpensively. The composite material is specifically usable as a heat sink substrate for semiconductor packages.

In order to attain these objects of ensuring both the conformity of thermal expansion coefficient and the heat-releasability in accordance with the opposite material and of improving the manufacture efficiency, the present inventors variously investigated and, as a result, have found that a five-layered composite material can be obtained by pressure-welding metal foils of high thermal expansion to both surfaces of a core sheet, which is composed of a metal sheet of high thermal expansion sandwiched between two metal sheets of low thermal expansion, each having a number of through-holes in the direction of their thickness, the three sheets constituting the core sheet being laminated and integrated so that a part of the metal sheet of high thermal expansion is exposed out to the metal surface of low thermal expansion through the through-holes of the metal sheet of low thermal expansion, whereupon the thickness ratio of the metal sheets of constituting the core sheet and the exposing surface area ratio through the through-holes are properly selected so that the composite material may have any desired thermal expansion coefficient and thermal conductivity. We have additionally found that the heat-receivability of the composite material is uniformalized, the heat-diffusibility thereof is improved, the surface thereof is free from fine pores and the weldability thereof to a thin film of a plate coat or brazing material is improved because of the provision of the surface metal foils of high thermal expansion as laminated to the core sheet. Moreover, we have further found that the intended heat-conductive composite material can easily be prepared by pressure-welding and rolling the innermost metal sheet of high thermal expansion as placed between two metal sheets of low thermal expansion, each having a number of through-holes in the direction of the thickness the three metal sheets constituting the core sheet, along with the outermost metal foils of high thermal expansion to sandwich the core sheet therebetween.

Specifically, in accordance with the present invention there is provided a heat-conductive composite material comprising a core sheet, which is composed of a metal sheet of high thermal expansion sandwiched between two metal sheets of low thermal expansion, each having a number of through-holes in the direction of the thickness, the three sheets being laminated and integrated so that a part of the metal sheet of high thermal expansion is exposed out to the metal surface of low thermal expansion through the through-holes of the metal sheet of low thermal expansion, and metal foil layers of high thermal expansion welded to both surfaces of the core sheet, the metal foil layers being the same as or different from the metal of high thermal expansion of the core sheet.

As one preferred embodiment of the present invention, the thickness ratio of the metal sheets of the core sheet and/or the surface area ratio of the metal spots of high thermal expansion as exposed out to the surface of the metal sheet of low thermal expansion to the metal of low thermal expansion are/is properly selected in the above-mentioned construction of the heat-conductive composite material of the invention, whereby the thermal expansion coefficient and/or the thermal conductivity of the composite material are/is controlled to desired values.

Further, in accordance with the present invention, there is provided a heat-conductive composite material comprising a metal sheet of high thermal expansion composed of Cu, Cu alloy, Al, Al alloy or steel, two metal sheets of low thermal expansion composed of Mo, Ni—Fe alloys containing from 30 to 50 wt. % of Ni, Ni—Co—Fe alloys containing from 25 to 35 wt. % of Ni, Ni—Co—Fe alloys containing from 4 to 20 wt. % of Co or W and a metal foil of high thermal expansion composed of Cu, Cu alloy, Al, Al alloy, Ni or Ni alloy, wherein a thickness $t_1$ of the metal sheet of high thermal expansion constituting a core sheet, a thickness $t_2$ of the metal sheets of low thermal expansion constituting the core sheet and a thickness $t_3$ of the metal foil of high thermal expansion satisfy the relations of $t_1 = 1 \; t_2 - 3 \; t_2$ and $t_3 = 1/10 \; t_2$. The above-mentioned heat conductive material has at least on main surface plated with a metal consisting of Cu, Al, Ni or Sn in the predetermined position.

For instance, a metal sheet of high thermal expansion, such as Cu or Al, is sandwiched between two metal sheets of low thermal expansion, such as Ni—Fe alloy or Ni—Co—Fe alloy, having a number of through-holes in the direction of the thickness and is integrated therebetween so that a part of the metal of high thermal expansion is exposed out to the surfaces of the metal sheets of low thermal expansion through the through-holes, and an outermost layer of a metal foil of high thermal expansion, such as Cu, Al or Ni, is welded under pressure to both surfaces of the thus-integrated core sheet to give the heat-conductive composite material of the invention. The composite material of the invention having such a construction may be press-shaped, laminated or coated by plating or brazing to prepare heat sink substrates for mounting chips thereon or lead frames for ceramic packages or metal packages.

BRIEF DESCRIPTION OF THE DRAWINGS

FIGS. 2-a, 3-a, 4-a and 6 are cross-sectional explanatory views each showing examples of semiconductor packages having the heat-conductive composite material of the present invention.

FIGS. 2-b, 3-b and 4-b are perspective explanatory views each showing the heat-conductive composite material of the present invention.

FIGS. 4-d and 4-e are longitudinal explanatory views each showing the heat conductive composite material of other examples of the present invention.

DESCRIPTION OF THE PREFERRED EMBODIMENTS

Figure 1A:
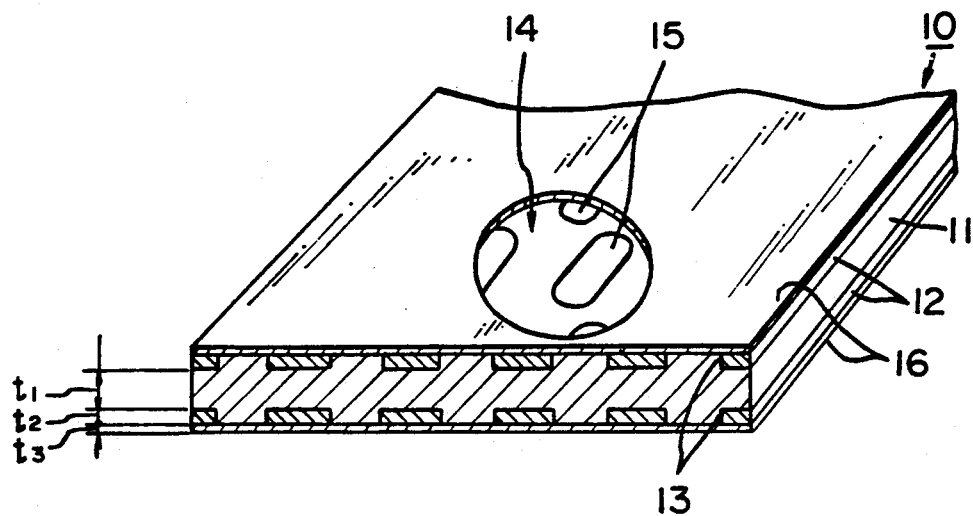
FIGS. 1-a and 1-b are perspective explanatory views each showing the heat-conductive composite material of the present invention.

The heat-conductive composite material of the present invention is characterized by a five-layered structure where a metal sheet of high thermal expansion is sandwiched between metal sheets of low thermal expansion, each having a number of through-holes in the direction of the thickness and is integrated therebetween to give a core sheet whereupon a part of the metal sheet of high thermal expansion is exposed out to the surfaces of the metal sheets of low thermal expansion through the through-holes and both surfaces of the core sheet are coated with a metal foil of high thermal expansion by welding under pressure to give the five-layered structure. Especially, the thermal expansion coefficient of the five-layered composite material may freely be varied by properly selecting the thickness ratio of the three metal sheets of the core sheet; and the thermal conductivity thereof may also freely be varied by using a metal sheet of high thermal conductivity as the metal of high thermal expansion of the core sheet and by properly selecting the surface area ratio of the exposed metal sheet of high thermal expansion to the metal sheet of low thermal expansion. Accordingly, various kinds of composite materials having any desired thermal expansion coefficient and thermal conductivity in accordance with various uses and objects can be prepared in accordance with the present invention by properly selecting the materials of the metal sheet of high thermal expansion and the metal sheet of low thermal expansion and the combination of the two metal sheets and also by properly selecting the above-mentioned thickness ratio and exposing surface area ratio.

Additionally, the heat-receiving property may be uniformalized and the heat-diffusing effect may be improved by provision of the outermost metal foil layer of high thermal expansion, and therefore composite materials for various uses having an excellent weldability to the opposite material to be welded thereto, having an excellent surface property with no fine pores thereon and having an excellent adhesiveness to a thin film such as a plate coat or brazing material to be applied thereto.

For preparing the heat-conductive composite material of the resent invention, the both surfaces of a metal sheet of high thermal expansion are laminated with a metal sheet of low thermal expansion, the metal sheet of low thermal expansion having been previously perforated to have a number of through-holes on the complete surface of the sheet or on a part thereof in the direction of the thickness with determined intervals and patterns. In forming the through-holes through the metal sheet of low thermal expansion, the pore size, the shape and the arranging pattern of the through-holes are variously changed, or perforating or not-perforating notches are formed in the direction of the thickness of the metal sheet in consideration of the deformation of the sheet in rolling. Such various means can be employed in combination for the purpose of properly controlling the thickness ratio of the metal sheets of the core sheet and/or the surface area ratio of the metal sheet of high thermal expansion as exposed out to the surface of the metal sheet of low thermal expansion to the metal sheet of low thermal expansion. Accordingly, the intended thermal expansion coefficient and thermal conductivity can be determined for the whole of the composite material or for a part thereof. As a result, the thus determined thermal expansion coefficient of the resulting composite material of the present invention may well be conformable with that of the opposite material, such as metals, ceramics, Si or the like semiconductors or plastics, which is to be welded to the composite material and, additionally, the composite material of the invention is to have a desired thermal conductivity.

For instance, where the thermal expansion coefficient of the composite material which is to be conformed to the chip to be mounted on the material is different from that which is to be conformed to the sealant resin to be applied to the material, the conditions of the surface area ratio of the metal sheet of high thermal expansion on the surface of the metal sheet of low thermal expansion where the chip is to be mounted and the thickness of the metal sheet of low thermal expansion as well as the condition of the surface of being in direct contact with the sealant resin in the back surface thereof are varied as mentioned above, whereby the thermal characteristics of the respective main surfaces can be made similar to the desired values.

Additionally, by properly selecting the material of the outermost metal foil layer of high thermal expansion in accordance with the use and the material of the opposite part, the weldability to the opposite part and the strength of the thin film to be coated over the metal foil layer may desirably be controlled.

In the construction of the core sheet composed of the metal sheet of high thermal expansion as sandwiched between two metal sheets of low thermal expansion, a laminate sheet comprising plural kinds of metals of high thermal expansion can be used as the metal sheet of high thermal expansion to be sandwiched between the two metal sheets of low thermal expansion whereupon the kind of the metal sheet of high thermal expansion to be exposed out to the surface of the metal sheet of low thermal expansion through the through-holes thereof may differ in the respective surfaces. Accordingly, such various constructions can be employed in the present invention.

The difference in the thermal expansion coefficient between the metal sheet of high thermal expansion and the metal sheets of low thermal expansion which constitute the core sheet of the composite material of the invention is not always necessary to be large but any desired combination of the metal sheets can be employed in accordance with the use of the composite material, provided that the thermal expansion coefficient of the respective constitutive metal sheets differs from each other.

The thermal expansion coefficient of the composite material of the present invention can freely be selected between the thermal expansion coefficient of the metal sheet of high thermal expansion and that of the metal sheet of low thermal expansion, by properly controlling the volume ratio of the metal sheet of high thermal expansion to the metal sheets of low thermal expansion in the construction of the core sheet, or that is, by properly controlling the thickness ratio of the respective laminate sheets in the same construction.

For instance, the conventional chip is required to have a thermal expansion coefficient ($\alpha$) of from $3 \times 10^{-6}$ to $8 \times 10^{-6}$/°C., more preferably from $4 \times 10^{-6}$ to $6 \times 10^{-6}$/°C., as the mean thermal expansion coefficient to 30° C. to 200° C.

In preparing a heat sink substrate for mounting the said chip thereon, a metal sheet of low thermal expansion having a mean thermal expansion coefficient of $10 \times 10^{-6}$/°C. or lower at 30° C. to 200° C., such as Ni—Fe alloy or Ni—Co—Fe alloy, and a metal sheet of high thermal expansion having a mean thermal expansion coefficient of more than $10 \times 10^{-6}$/°C. at 30° C. to 200° C., such as Cu or Cu alloy, can be employed in combination. In particular, the metal sheet of high thermal expansion is desired to have a thermal conductivity of 140 w/m.k or more at 20° C. Additionally, it is also desired that the surface are ratio of the metal sheet of high thermal expansion on the surface of the metal sheet of low thermal expansion is selected from the range of from 20 to 80%. Variation of the surface area ratio may appropriately be effected, for example, by varying and controlling the diameter of the through-holes, the size thereof as well as the pitches in arrangement of the through-holes.

Since the metal sheet of high thermal expansion which constitute the core sheet is filled into the through-holes of the metal sheets of low thermal expansion under pressure by pressure-welding or forging, the metal sheet of high thermal expansion is preferably made of material having high extensibility and flexibility, such as Cu, Cu alloys, Al, Al alloys or steel.

As the metal sheet of low thermal expansion, materials having high extensibility, such as Mo, Ni—Fe alloys containing from 30 to 50 wt. % of Ni, Ni—Co—Fe alloys containing from 25 to 35 wt. % of Ni and from 4 to 20 wt. % of Co, as well as W, can be employed.

As the metal foil of high thermal expansion which is to be welded to both surfaces of the core sheet as the outermost layer, materials of Cu, Cu alloys, Al, Al alloys, Ni and Ni alloys can be selected. The material of the outermost metal foil layer may be same as or different from the material of the metal sheet of high thermal expansion constituting the core sheet, in consideration of the use of the composite material as well as the material of the thin layer film to be superposed over the outermost metal foil layer.

The heat-conductive composite material of the present invention is characterized by the above-mentioned five-layered construction. Additionally, for the purpose of improving the brazability and corrosion-resistance and improving the coatability of Au- or Ag-plate coat in accordance with the use of the composite material, Cu, Al, Ni or Sn may be applied to the surface of the outermost metal foil layer by metal-plating, evaporating-plating, ion plating, CVD (chemical vapour deposition) or the like known coating means, or solder, an Ag-brazing material, a ceramic material or a glass layer may also be coated over the surface thereof or may be applied to the determined positions of the surface thereof.

For preparing the core sheet for the composite material of the present invention, for example, a lot of through-holes are first punched in a metal sheet of low thermal expansion in the determined positions in the direction of the thickness, the surface of the thus punched metal sheet, which is to be welded to a metal sheet of high thermal expansion, is cleaned by washing with an acid or by brushing, the thus cleaned and punched metal sheets are applied to both surfaces of a metal sheet of high thermal expansion and welded by cold-rolling, warm-rolling or hot-rolling and, optionally, the thus welded sheet is subjected to diffusive heat-treatment so as to improve the welding between the respective sheets. That is, any known pressure welding, rolling or forging techniques can be employed in preparing the core sheet. Next, a metal foil of high thermal expansion is welded to both surfaces of the thus prepared core sheet by cold-rolling or, warm-rolling or hot-rolling and thereafter the thus welded composite material is optionally subjected to heat-treatment. Accordingly, the composite material of the present invention can be mass-produced in an industrial large-scaled plant and all the materials thus mass-produced always have stable characteristics.

Alternatively, each material for the above-mentioned five layers may be separately cleaned and then all the materials for the five layers may be welded simultaneously by cold-rolling, warm-rolling or hot-rolling and then subjected to heat-treatment. In such case, the means of cold-rolling, warm-rolling or hot-rolling as well as the roll diameter, the number of the rolling stages and the reduction ratio are to be appropriately selected and determined in accordance with the combination of the materials of the five layers, the dimension of the through-holes or notches as formed in the metal sheets of low thermal expansion in the direction of the thickness thereof, as well as the arrangement pattern of such through-holes or notches. For instance, where the five layers are welded by cold-rolling, the metal sheet of high thermal expansion in the core sheet may be heated just before the pressure-welding. Anyway, the conditions for the cold-rolling, warm-rolling or hot-rolling, as well as various ambient atmospheres of inert gases, non-oxidative gases or reduced pressure gases may properly be selected in accordance with the combination of the materials of the five layers to be welded, the thickness of the respective layers and other various elements.

In manufacturing the heat-conductive composite materials of the present invention by industrial large-scaled mass-production, it is most effective to employ the pressure-welding and rolling technique by the use of pressure rolls for cold-rolling or hot-rolling, as mentioned above. In particular, where the thickness of the final product is relatively large (for example, approximately 1 mm or more) and the final product is prepared as individual pieces, a method may be employed where the necessary materials are laminated in the inside of a die and are pressure-welded and integrated therein under warm-pressure (that is, pressure is imparted to the laminated materials at a temperature lower than the re-crystallization temperature of the respective materials) or under hot-pressure (that is, pressure is imparted to the laminated materials at a temperature lower than the melting point of the respective materials).

Optionally, the both surfaces of the above-mentioned core sheet may be plated with a thick plate of Cu or Ni in a thickness of from 2 to 5 um and then heat-treated by conventional soaking treatment. Next, this is rolled and then annealed for diffusion, whereby the intended five-layered heat-conductive composite material of the present invention having a metal foil layer of high thermal expansion as the both outermost layers is obtained.

The shape and arrangement of the metal sheet of high thermal expansion to be exposed out to the surface of the metal sheet of low thermal expansion, in the composite material of the present invention, may variously be changed in accordance with the object and the method of manufacturing the composite material, as mentioned above.

For instance, in order to uniformalize the mechanical strength in the widthwise direction of the material, it is desired that the through-holes be so arranged that the hole pattern with the same size and the same shape is not repeated, or the through-holes are so inclined that they do not conform to the direction of the thickness of the core sheet after the sheet has been pressure-welded and rolled, or the through-holes are so tapered that the hole size may differ from each other between the front surface and the back surface of the sheet and additionally the hole sizes of the adjacent through-holes are different from each other.

The distance between the through-holes is advantageously narrow for the purpose of reducing the dispersion of the products. Generally, it is 3 mm or less, preferably 1 mm or less, more preferably 0.5 mm or less.

For forming the through-holes in the metal sheet of low thermal expansion in the direction of the thickness thereof, not only mechanical working such as press-punching but also chemical processing such as etching can be employed. Regarding the shape of the through-holes, the cross section may be circular, oval or polygonal and the longitudinal section may be straight or tapered. Accordingly, the through-holes may have various shapes as above. Where they are tapered, introduction of the metal of high thermal expansion under pressure into such tapered through-holes is easy and, as a result, the welding strength of the core sheet may be elevated.

Anyway, the through-holes to be formed in the metal sheet of low thermal expansion in the direction of the thickness thereof may be such desired ones that they are filled with the metal sheet of high thermal expansion after pressure-welding and rolling. For instance, various through-holes may be formed in the non-rolled metal sheet of low thermal expansion in the desired direction of the thickness thereof, or notches just before through-holes may be formed therein, or various notches with various shapes may be formed in both surfaces of the metal sheet in various directions. Accordingly, the through-holes to be formed in the metal sheet of low thermal expansion may be variously so selected that they may be arranged as mentioned above. Regarding the shapes of the notches to be formed, various shapes of "—", "+" or "<" may be employed. As the case may be, notches of trigonal pyramid-like wedges (▶) may be formed in the said metal sheet in any desired direction of the thickness thereof.

As having the particular construction mentioned above, the composite material of the present invention may have an intrinsic thermal expansion coefficient and an intrinsic thermal conductivity. In addition, plural composite materials of the present invention each having a different thermal expansion coefficient and a different thermal conductivity can be laminated in the direction of the thickness thereof to prepare a laminate composite material having any desired thermal expansion coefficient and thermal conductivity. Furthermore, two or more of the above-mentioned core sheets may also be laminated and a metal foil layer of high thermal expansion may be welded to both surfaces of the resulting laminate core sheet to obtain a composite material of the present invention of a different construction.

In the composite material of the present invention, the metal foil layer of high thermal expansion to form the outermost layer of the material is provided for the purpose of uniformalizing the heat-receiving property of the material, the heat-diffusing effect thereof, the weldability thereof to the opposite material and the coatability of a thin film layer over the material. In order to obtain such effects, the thickness of the outermost metal foil layer is necessary to be 2 $\mu$m or more. However, if it is more than 100 $\mu$m, the conformity of the thermal expansion coefficient would be hardly obtained. Accordingly, the thickness is to be from 2 to 100 um.

The thickness of the core sheet varies in accordance with the use and object. It is necessary to be at least 0.1 mm. However, if it is more than 30 mm, manufacture of the composite material by rolling would be difficult.

Figure 1B:
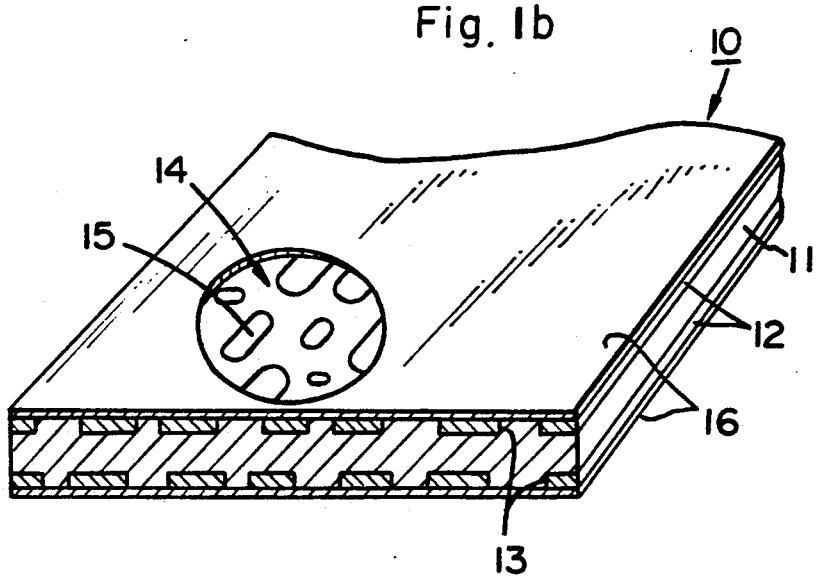

Regarding the thickness ratio of the metal sheet of high thermal expansion to the metal sheets of low thermal expansion in the construction of the core sheet, FIG. 1 is referred to, where the thickness of the metal sheet of high thermal expansion ($t_1$), the thickness of the metal sheet of low thermal expansion ($t_2$) and the thickness of the outermost metal foil layer of high thermal expansion ($t_3$=preferably satisfy the relations of $t_1 = 1t_2$ to $3t_2$ and $t_3 \leq (1/10)t_2$.

As will be illustrated in more detail in the example to follow hereunder, the heat-conductive composite material of the present invention can be worked into various forms. For instance, it may be cut out into a flat plate and is brazed before practice use; or it may be stamped out into any desired shape and two or more of the thus stamped pieces may be laminated or the stamped piece may be laminated with any other heat-conductive materials; or it may be press-shaped into a cap form; or it may be bent into any desired shape to prepare a flexible heat-conductive composite material. Moreover, the composite material of the present invention may also be coated or welded with the above-mentioned metal plate coat or with an Ag-brazing material, ceramic or glass layer.

Next, the present invention will be explained in more detail by way of the drawings as attached hereto.

In the following explanation, an example where a Cu sheet is employed as the metal sheet of high thermal expansion for the core sheet and a Kovar (Fe—Co—Ni alloy) sheet is as the metal sheet of low thermal expansion for the same is illustrated.

In the construction of FIG. 1-a and FIG. 1-b, the heat-conductive composite material (10) is composed of core sheet (14) comprising Cu sheet (11) as sandwiched between Kovar sheets (12)(12) each having many through-holes (13) in the direction of the thickness thereof, the three sheets being welded under pressure, and metal foil layers of high thermal expansion (16)(16) as welded to both surfaces of the core sheet (14) under pressure.

On both surfaces of the core sheet (14), Cu-exposed surface (15) is formed, where Cu is exposed out to the surface of the Kovar sheet (12) through the through-hole (13). In the construction of FIG. 1-a, plural through-holes (13)(13), each having the same size, are formed in the direction of the thickness of the sheet and long oval-shaped Cu-exposed surfaces (15)(15) . . . are accordingly arranged. In the construction of FIG. 1-b, the through-holes are so tapered that the hole sizes differ from each other between the front surface and the back surface and these are so arranged that the sizes of the adjacent holes also differ from each other.

In each of the constructions, the thickness of the two Kovar sheets (12)(12) to be pressure-welded to both surfaces of the Cu sheet (11) form the core sheet (14) as well as the proportion of the copper-exposed surfaces (15)(15) . . . and the dispersion state thereof, may properly be selected so that the thermal characteristics of the respective main surfaces may be made similar to the required characteristics.

As the outermost metal foil layer of high thermal expansion (16) to be pressure-welded to both surfaces of the core sheet (14), any desired one is selected from foils of Cu, Cu alloys, Al, Al alloys, Ni and Ni alloys in consideration of the use of the composite material and the material of a thin film layer to be superposed over the outermost foil layer. Accordingly, the heat-receiving property of the composite material is uniformalized, the heat-diffusing property thereof is improved, the weldability thereof to the opposite material is improved, and the coatability of the thin film layer over the composite material is improved.

Next, some typical embodiments of the present invention will be explained hereunder.

Construction 1

FIG. 2-a and FIG. 2-b show a heat-conductive composite material (20) of the present invention which is employed a the heat sink substrate for a ceramic package, as one example. The material is cut into a rectangular plate in accordance with the size of the package, and an Ag-braze (32) is applied to the determine surface part, as shown in the drawings.

The heat-conductive composite material (20) may be, for example, the heat-conductive composite material (10) shown in FIG. 1-a and FIG. 1-b, where the thickness ratio of the Cu sheet (11) to the Kovar sheet (12) as well as the proportion of the Kovar sheet (12) to the copper-exposed surface (15) is properly selected in the construction of the core sheet (14) for the purpose of obtaining the desired thermal conformity between the material (20) and the chip (31), and the metal foil layer (16) is made of a Cu foil which has been coated with an Ni plate coat or is made of a Ni foil. Accordingly, the brazability with the Ag-braze (32) is improved so that the weldability with the ceramic (30) is thereby improved. Precisely, where the surface of the heat-conductive composite material (20) is the Cu foil, the Ag-braze (32) would react with the Cu foil when it is molten and, as a result, the thermal conductivity of the material would lower because of the formation of the reacted surface. Therefore, formation of the Ni plate coat, which generally has a thickness of approximately from 2 to 10 um, over the Cu foil is necessary in such case. In particular, for the purpose of improving the coatability of the Ni plate coat over the Cu foil, it is desired that the heat-conductive composite material (20) which has been coated with an Ni plate coat over the surface of the Cu foil layer is subjected to soaking treatment (for recrystallization and annealing) in an inert atmosphere such as Ar or $N_2$ or in a reducing atmosphere such as $H_2$, under the condition of a temperature of from 750° C. to 950° C. and a period of time of from 2 minutes to 1 hour. The construction of FIG. 2 illustrates one example where the Ag-braze (32) is coated on the determined position of only surface of the heat-conductive composite material (20). As the case may be, and in accordance with the use of the composite material, such Ag-braze may be applied to the complete surface of one surface of the heat-conductive composite material (20) or to both surfaces thereof. In any case of such constructions, it is desired that the Ni plate coat be coated over the surface of the heat-conductive composite material (20) prior to the application of the Ag-braze thereto.

The Ni plate coat functions to not only prevent Ag-braze and Cu from being reacted with each other but also to improve the flowing of Ag-braze so that an air-tightness of the package can be improved. Where the Ag-braze is previously applied to the heat-conductive composite material (20) as shown in FIG. 2, the thickness of the Ag-braze is desirably approximately from 30 to 120 μm in view of the weldability of the braze to the package and the workability of the composite material into the desired package. In the drawings, the chip (31) is applied to the material (20) with an Au—Si braze.

Construction 2

FIG. 3-a and FIG. 3-b show a heat-conductive composite material (21) of the present invention, which is employed as the heat sink substrate for a ceramic package as another example. The material (21) is same as the heat-conductive composite material (20) shown in FIG. 2-a and FIG. 2-b, except that another heat-conductive composite material (22) having the same construction has been laminated on the center part of the material (21) by brazing. The chip (31) is welded to the thus laminated material (22) by Au—Si-brazing.

In this case, the materials of the core sheet (14) and the construction thereof and the material of the metal foil layer (16) are desired to be so selected and controlled, in preparing the heat-conductive composite materials (21) and (22), that the main composite material (21) is similar to the ceramic (30) with respect to thermal characteristics and that the laminated composite material (22) is similar to the chip (31) with respect to the thermal characteristics.

In the construction of FIG. 3, where a pair of the heat-conductive composite materials (21) and (22) are integrated together by Ag-brazing, it is desired that at least the surface of the respective heat-conductive composite materials to which Ag-braze is to be applied is previously Ni-plated, like the construction of FIG. 2. However, application of such Ag-braze to also the surface of the composite material on which the chip is to be mounted is unfavorable, as it would cause roughening of the surface thereof on which the chip is to be mounted so that the accuracy of the position of the chip mounted would lower. Therefore, the outer peripheral surface of the heat-conductive composite material (22) in the side on which the chip is to be mounted is not rather coated with the Ni-plate coat which improves in the flowability of the Ag-braze, but the flowability of the Ag-braze on the said surface is desired to be lowered.

Additionally, as shown in the drawings, where the laminated heat-conductive composite material is arranged in the ceramic package, a method is employed in which the pair of the heat-conductive composite materials (21) (22) are previously integrated by Ag-brazing and then one heat-conductive composite material (21) is further integrated with the ceramic (30) also by Ag-brazing. However, in order to ensure the accuracy of the position of the chip (31), another method may also be employed in which an Ag-braze is previously applied to one main surface of one heat-conductive composite material (21), the other heat-conductive composite material (22) is then temporarily attached to the Ag-braze-coated surface by mechanical pressure means, and the Ag-brazing between the materials (21) and (22) may be completed at the same time of welding the material (21) and the ceramic (30) also by the same Ag-brazing.

Construction 3

Figure 4C:
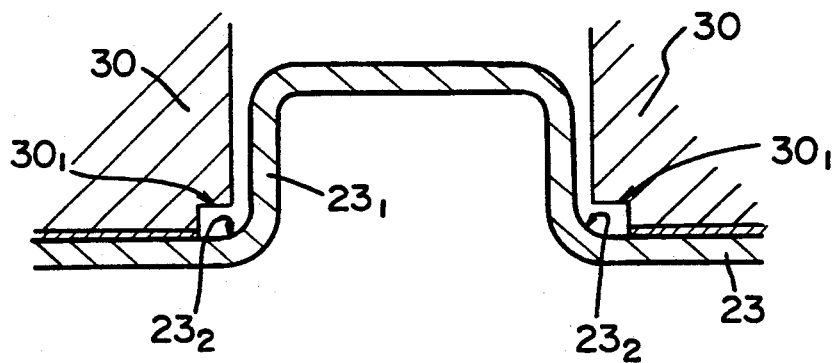
FIG. 4-c is a longitudinal partially-enlarged view showing a detail of FIG. 4-a.
Figure 4D:
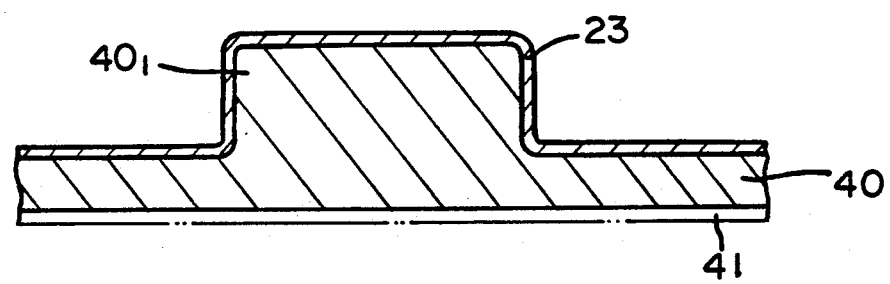
Figure 4E:
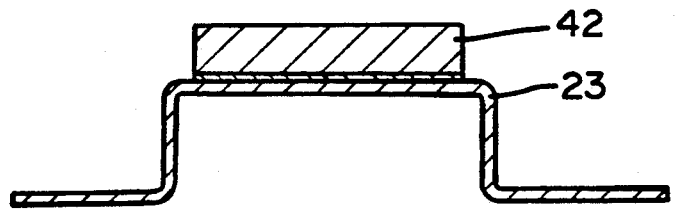

FIG. 4-a and FIG. 4-b show a heat-conductive composite material (23) of the present invention, which is employed as the heat sink substrate for a ceramic package as still another example. The material (23) is same as the heat-conductive composite material (20) shown in FIG. 2-a and FIG. 2-b, except that it is press-shaped into a cap having the dimension which accords with the size of the package. In this construction, the peripheral part of the material is brazed with the ceramic (30), and the chip (31) is welded to the projected surface of the material by Au—Si-brazing.

Referring to FIG. 4-c, the cap-shaped material (23) can be prepared with ease by press-shaping. The heat-conductive composite material (23) has not only the intrinsic thermal characteristic effect but also has an additional effect that the influence by the difference in the thermal expansion between the ceramic package, chip and heat-conductive composite material (23) may be reduced because of the formation of the cap-shaped cylinder part ($23_1$).

In this construction, it is necessary that the thickness of the heat-conductive composite material (23) is properly controlled within the possible range for press-shaping. In particular, where the thickness of the heat-conductive composite material (23) is enlarged for the purpose of satisfying the required thermal characteristics, the value (R) in the folded part (23₂) would inevitably large as shown in FIG. 4-c and, as a result, the hole diameter of the ceramic package would therefore be large. In order to avoid the problem, it is desired that a notch part (30₁) is formed in the inner diameter open edge part of the ceramic package.

Figure 9A:
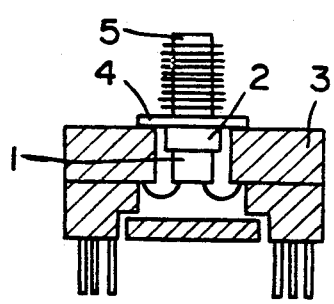
FIGS. 9-a and 9-b are longitudinal sectional explanatory views each showing packages having a conventional heat sink substrate.
Figure 9B:
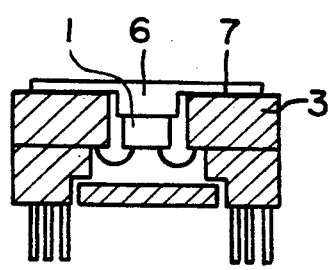
Figure 10:
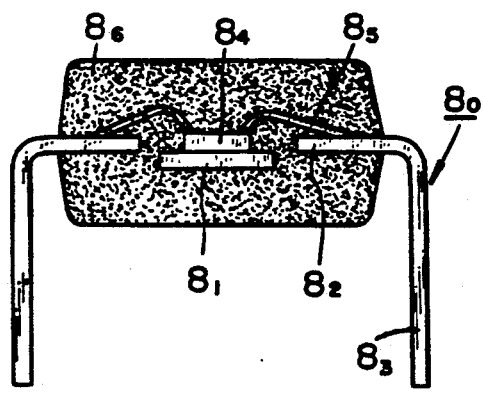
FIG. 10 is an outline view of a semiconductor package.

Referring to FIG. 4-d, if the thickness of the heat-conductive composite material (23) is made small in consideration of the press-shapability or other properties of the material, the material would deform because of the stress to be applied there in the step of welding the chip thereto and, as a result, not only the appropriate arrangement of the chip on the material would be difficult but also the desired heat-releasing effect (especially, heat-releasing effect in the direction parallel to the surface of the material) could not be obtained. In order to avoid the problem, employment of the construction of FIG. 4-d is recommended, where a reinforcing material (40) which is made of a highly heat-conductive material, such as Cu, Cu alloys, Al or Al alloys, and which has the projection (40₁) in the center thereof is engaged and integrated with the cap-shaped heat-conductive composite material (23).

Where the reinforcing material (40) is properly controlled to have the optimum shape and dimension, the heat-release fin (5) as shown in FIG. 9-a, which indicates one conventional example, would be unnecessary.

On the other hand, if the reinforcing material (40) is thin and warping is considered because of the bimetal effect with the heat-conductive composite material (23), it is desired that one surface of the reinforcing material (40) (that is, the other main surface opposite to the surface to be welded with the heat-conductive composite material (23)) is coated with an alloy of ow thermal expansion, such as Ni—Fe alloy.

Referring to FIG. 4-e, for the purpose of preventing deformation in the step of welding a chip to the composite material of the invention and in consideration of the difference in the thermal expansion between the chip and the composite material, the construction of FIG. 4-e is preferred, where an additional heat-conductive composite material or a reinforcing material (42), for example, a sheet of Mo, Cu—Mo alloys or Cu—W alloys, which has a determined thickness, is previously applied to the surface of the heat-conductive composite material (23) on which a chip is to be mounted.

As mentioned above, the present inventors have proposed various constructions of effectively employing the heat-conductive composite material (23) as press-shaped into a cap form. Additionally, they have further confirmed that where the heat-conductive material of the present invention generally has a thickness of approximately from 0.2 to 0.3 mm, it may be press-shaped into any desired cap form and it may have favorable thermal characteristics.

In every construction as mentioned above, application of an Ag-braze to the surface of the composite material on which a chip is to be mounted is not desired, like the construction of FIG. 3. It is rather desired that the inner cylindrical part of the cap-shaped material and the surface of the material on which a chip is to be mounted is not coated with an Ni-plate coat which improves in the flowability of the Ag-braze but is to be the metal foil surface of high thermal expansion, such as Cu.

Construction 4

Figure 5:
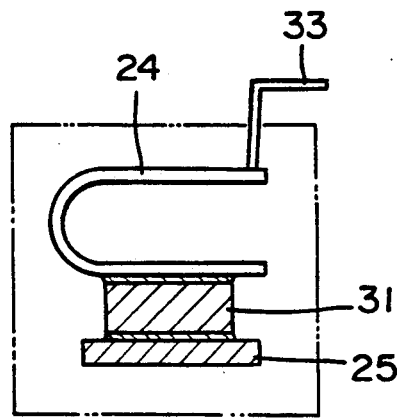
FIG. 5 is a longitudinal explanatory view showing a part of a high power module using the heat conductive composite material of the present invention.

FIG. 5 shows a heat-conductive composite material (24) of the present invention which is employed as the high power module, as one example. The material (24) is bent in a U-shape, a solder layer is coated on a determined portion, a Cu lead (33) is connected to one end of the material (24), a chip (31) is sandwiched between the material (24) and another heat-conductive composite material sheet (25) by brazing, and the whole is resin-moulded.

In the present invention a pair of the heat conductive composite materials (24) and (25) are reeds for flowing a large current and function to radiate the heat generated from the chip (31). Particularly, the material (24) is bend in a U-shape which functions as a resilient member to absorb the vibration or like transmitted from the outside.

The heat-conductive composite materials (24) and (25) have the same construction as the heat-conductive composite material (10) shown in FIG. 1-a and FIG. 1-b, where the thickness ratio between the Cu sheet (11) and the Kovar sheet (12) and the proportion of the Kovar sheet (12) to the Cu-exposed surface (15) are properly selected and controlled in the construction of the core sheet (14) so that the materials may be well conformable to the chip (31) and the resin with respect to the thermal characteristics therebetween. Additionally, a Cu foil is used as the metal foil layer (16). Accordingly, the solderability of the materials is improved and the weldability thereof to the chip (31) is also improved.

Specifically, where the chip (31) is integrated with the heat-conductive composite materials (24) (25) by soldering, as shown in FIG. 5, the complete surfaces of the heat-conductive composite materials (24) (25) are made of Cu so that the solder flow is good and welding of the parts is effected well. In particular, the construction of the case where the heat-conductive composite material of the present invention is integrated with any other parts by the use of a welding agent having a low melting point, such as solder or the like, there is no problem of reaction between the brazing material of Ag or the like and Cu, which occurs in the constructions of FIG. 2, FIG. 3 and FIG. 4. Accordingly, it is unnecessary to additionally coat an Ni-plate coat over the surface of Cu in this case.

Although the case of coating the solder layer only on the determined position of the heat-conductive composite material has been illustrated as one example of the construction of FIG. 5 in the above, any other constructions where the solder layer is previously wholly applied to one main surface of the heat-conductive composite material or to both surfaces thereof may also be employed in accordance with the use and object.

Construction 5

Figure 6:
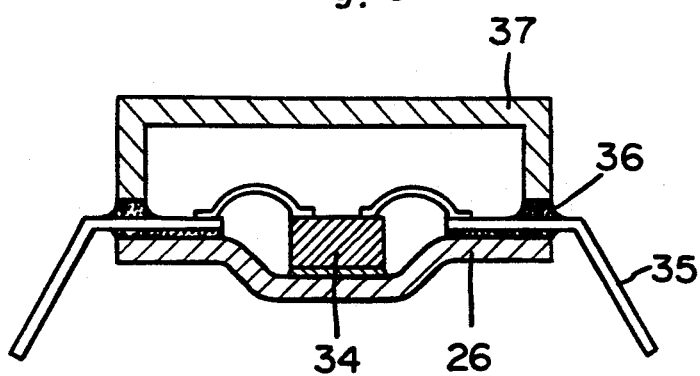

FIG. 6 shows a heat-conductive composite material (26) of the present invention which is employed as the heat sink substrate for a metal package, as one example. The material (26) is shaped into a ship bottom form so that it may house the chip (34). The chip (34) is mounted on the center bottom of the material (26) by brazing, and the peripheral part is covered with a metal cap (37) whereupon a lead frame (35) is inserted between the material (26) and the cap (35) and the parts (26), (35) and (26) are sealed with a glass (36).

The heat-conductive composite material (26) has the same construction as the heat-conductive composite material (10) shown in FIG. 1-a and FIG. 1-b, where the thickness ratio between the Cu sheet (11) and the Kovar sheet (12) and the proportion of the Kovar sheet (12) to the Cu-exposed surface (15) are properly selected and controlled in the construction of the core sheet (14) so that material may well be conformable to the chip (34) with respect to the thermal characteristics therebetween. Additionally, an Al foil is used as the metal foil layer (16). Accordingly, the glass sealability with the glass (36) is improved and the weldability with an Ag-braze or solder is also improved.

In the construction, since an Al foil is employed as the metal foil layer (16) of the heat sink substrate, the chip (34) is attached to the substrate via the insulating layer. Additionally, the outer surface of the metal foil layer (16) has been coated with a ceramic such as alumina or has been treated with Alumite for the purpose of improving the corrosion-resistance of the sealed product.

Where an Al coat is applied to the metal foil layer (16), which is a Cu foil, in the desired sealing part in the heat sink substrate of the above-mentioned construction 1, the glass-sealing property is excellent and the coatability with an Ag-braze or solder may also be improved.

Manufacturing Method

The method of manufacturing the composite material (1) having the construction as shown in FIG. 1-a and FIG. 1-b will be explained hereunder with reference to FIG. 7-a. A pair of Kovar sheets 12) (12) are previously punched with a press-punching machine so that they have a number of small through-holes in a netlike pattern. After annealing, the thus punched sheets are surface-treated and are coiled up.

A Cu sheet coil (11) having a determined dimension and a determined thickness is released while it is sandwiched between the above-mentioned Kovar sheets (12) (12) as being also released, and the thus sandwiched three sheets are passed through cold, warm or hot rolls and thus are rolled and welded. After welding, if desired, the welded sheet may be subjected to diffusive annealing of the purpose of improving the welding of the respective sheets.

As a result of the pressure-welding, Cu is introduced into the large number of through-holes (13) of the Kovar sheet (12), as shown in FIG. 1. Accordingly, the core sheet (14) where the Cu-exposed surfaces (15) (15) ... are partly arranged in the desired portions of the Kovar sheets (12) (12) is obtained. After diffusive annealing, the thus prepared core sheet is surface-treated and then coiled up.

Figure 7A:
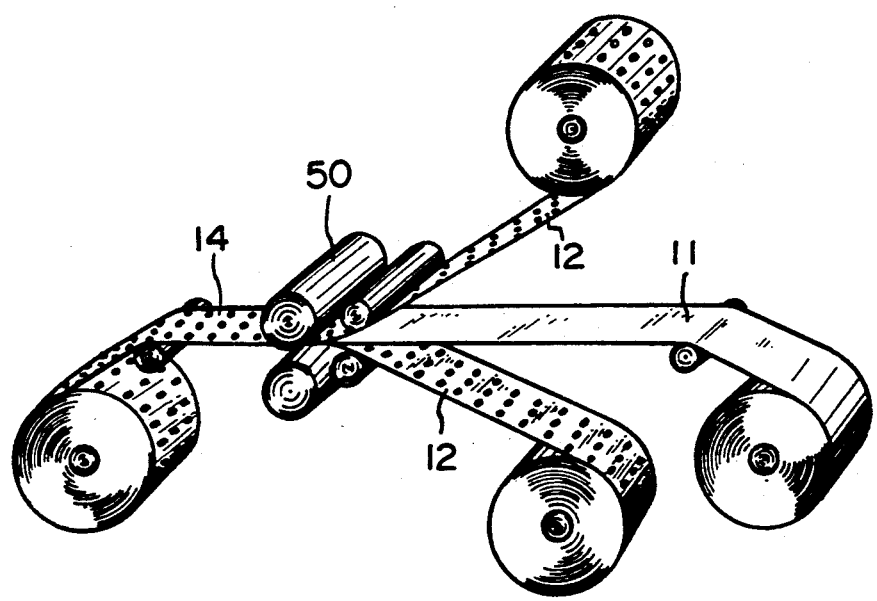
FIGS. 7-a, 7-b and 8 are perspective explanatory views each showing the outline of the method of preparing the composite material of the present invention.
Figure 7B:
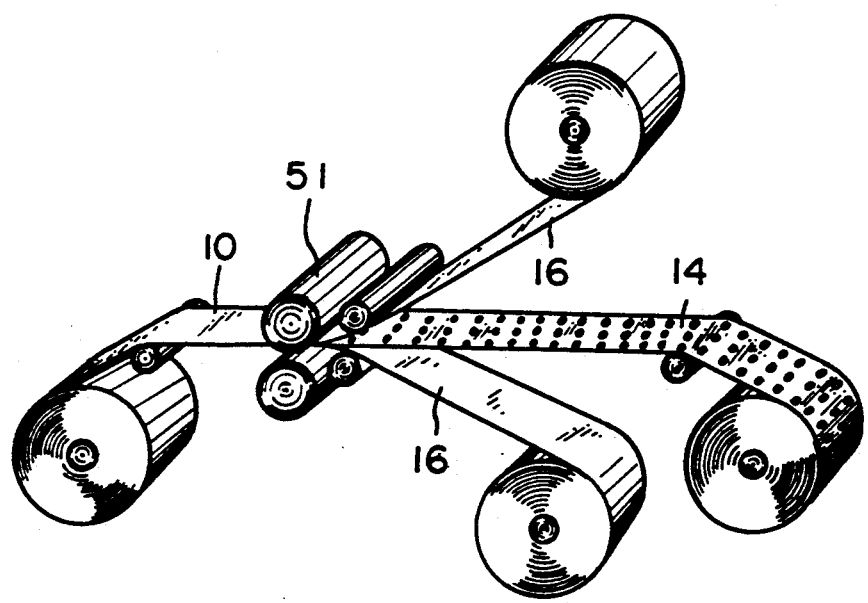

Next, as shown in FIG. 7-b, the core sheet coil (14) is released while it is sandwiched between released metal foils (16) (16) such as Cu or Al, and the thus-sandwiched three layers are passed through cold, warm or hot rolls (41) (41) and thus are rolled therebetween under pressure and welded.

Next, the thus prepared composite material is optionally subjected to diffusive annealing, if desired, and thereafter rolled to a determined thickness.

Figure 8:
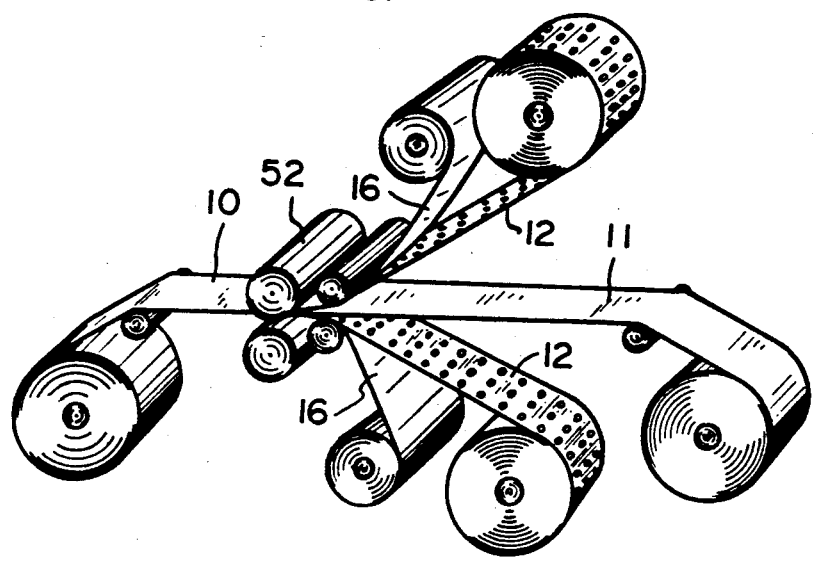

A another example which is illustrated in FIG. 8, an annealed and surface-treated Cu sheet coil (11) which has a determined dimension and a determined thickness is released while it is sandwiched between Kovar sheet coils (12) (12) as being released, the Kovar sheets each being previously press-punched, annealed and surface-treated, and the three sheets are further sandwiched between metal foil coils (16) (16) as being released, the metal foils each being previously surface-treated; and the resulting five layers are staged whereby they are rolled, welded and integrated.

As mentioned above, since the heat-conductive composite material of the present invention can be obtained in the form of a sheet having a desired dimension by rolling or pressure-welding means, any other complicated mechanical working means for finishing into a desired thickness is unnecessary. Accordingly, the composite material of the present invention can be manufactured inexpensively. Additionally, the material has an excellent machinability and therefore has an advantageous merit that it may easily be machined or worked into any desired shape in accordance with package substrates or chips.

The following examples are intended to illustrate the present invention in more detail but not to limit it in any way.

EXAMPLE 1

A number of through-holes each having a hole diameter of 0.1 mm were punched in a pair of Kovar sheets (29Ni—16Co—Fe alloy) each having a thickness of 0.5 mm and a width of 30 mm, at intervals of 1.5 mm between the holes. The sheets were then annealed at 900° C. and thereafter subjected to wire-brushing.

The Kovar sheets each had a mean thermal expansion coefficient of $5.2 \times 10^{-6}$/°C. at 30° C. to 200° C.

On the other hand, a Cu sheet having a thickness of 1.0 mm and a width of 30 mm was analogously annealed and subjected to wire-brushing. The Cu sheet used has a mean thermal expansion coefficient of $17.2 \times 10^{-6}$/°C. at 30° to 200° C.

The said Kovar sheets and Cu sheet were welded under pressure by the use of a cold pressure-welding machine, a shown in FIG. 7-a, to obtain a core sheet having a thickness of 0.85 mm.

Precisely, the copper penetrated into the through-holes of the Kovar sheets during cold pressure-welding and, as a result, the core sheet as shown in FIG. 1 was obtained, where the copper surface was partly exposed out to the surface of the Kovar sheets in the determined positions.

The core sheet thus prepared was subjected to diffusive annealing at 800° C. for 5 minutes to obtain a welded and integrated core sheet.

The Cu-exposed portions in the main surface of the thus obtained core sheet were in the form of an oval having the major axis in the rolled direction, and the intervals between the holes each were 1.0 mm in the rolled direction. The surface area ratio of the Cu-exposed portions to the Kovar sheet was 35%.

The core sheet thus obtained had a thermal conductivity of 230 W/m.k in the direction of the thickness and had a thermal expansion coefficient of $8 \times 10^{-6}$/°C.

A Cu foil having a thickness of 0.05 mm was attached to both surfaces of the core sheet having a thickness of 0.85 mm and pressure-welded by the use of a two-stage cold pressure-welding machine. Accordingly, a heat-conductive composite material having a thickness of 0.37 mm was obtained. In the thus obtained heat-conductive composite material, the thickness ($t_1$) of the Cu sheet to constitute the core sheet was 0.166 mm; the thickness ($t_2$) of the Kovar sheets each was 0.095 mm; and the thickness ($t_3$) of the outermost Cu foils each was 0.007 mm. (FIG. 1-a is referred to).

The heat-conductive composite material having a thickness of 0.37 mm was cut into various sizes, and two of the thus cut pieces were laminated to form a heat sink substrate as shown in FIG. 3-a.

Using the thus prepared heat sink substrate, a ceramic package was manufactured. As a result, it was confirmed that the heat-releasability of the package was good and the thermal conformity between the substrate and the package was also good.

Next, the heat-conductive composite material having a thickness of 0.37 mm was annealed and then cold-rolled into a thickness of 0.15 mm. In the thus obtained heat-conductive composite material, the thickness ($t_1$) of the Cu sheet to constitute the core sheet was 0.068 mm; the thickness ($t_2$) of the Kovar sheets each was 0.038 mm; and the thickness ($t_3$) of the outermost Cu foils each was 0.003 mm. Afterwards, the cold-rolled material was worked into a lead frame by a known method. This was then formed into a semiconductor package, which was free from troubles of peeling between the chip and the island in the adhered interface therebetween or cracking of the sealant resin. In addition, it was further confirmed that the lead frame had a good heat-releasing property like the conventional lead frame made of a copper alloy.

EXAMPLE 2

Using the same materials as those in Example 1, a heat-conductive composite material having a thickness of 0.37 mm was prepared by the same method and the same conditions as those in Example 1, except that the Cu sheet was previously heated before pressure-welding with the Kovar sheets to prepare the core sheet. In the thus-prepared heat-conductive composite material, the thickness ($t_1$) of the Cu sheet to constitute the core sheet was 0.158 mm; the thickness ($t_2$) of the Kovar sheets each was 0.100 mm; and the thickness ($t_3$) of the outermost Cu foils each was 0.006 mm.

The heat-conductive composite material having a thickness of 0.37 mm was annealed and then cold-rolled to a thickness of 0.25 mm. In the thus prepared heat-conductive composite material, the thickness ($t_1$) of the Cu sheet to constitute the core sheet was 0.106 mm; the thickness ($t_2$) of the Kovar sheets each was 0.068 mm; and the thickness ($t_3$) of the outermost Cu foils each was 0.004 mm. The thus-rolled heat-conductive composite material was then press-shaped into a cap-like form and was used as a heat sink substrate, as shown in FIG. 4-a. In shaping into the cap-like form of the composite material, it was confirmed that deep drawing into various forms is possible and therefore the press-shapability of the composite material was excellent.

Next, using the above-mentioned sink tank substrate, a ceramic package was prepared. As a result, it was further confirmed that the heat-releasability of the package was good and the thermal conformity between the substrate and the package was also good.

EXAMPLE 3

A number of wedge-wise notches each having a width of 1.0 mm or 0.5 mm were formed on the both surfaces of each of a pair of Kovar sheets (29Ni—16-Co—Fe alloy) each having a thickness of 0.5 mm and a width of 30 mm, and the thus notched sheets were annealed at 900° C. and then wire-brushed.

On the other hand, a Cu sheet having a thickness of 1.0 mm and a width of 30 mm was analogously annealed and wire-brushed.

The Cu sheet was sandwiched between the Kovar sheets, and a surface-cleaned Al foil having a thickness of 0.05 mm was attached to both surfaces of the Kovar sheets. Then, the thus-laminated five layers were pressure-welded by the use of a warm pressure-welding machine equipped with multi-stage rolls. Accordingly, a heat-conductive composite material having a thickness of 0.4 mm was obtained, as shown in FIG. 1-b. In the heat-conductive composite material, the thickness ($t_1$) of the Cu sheet to constitute the core sheet was 0.178 mm; the thickness ($t_2$) of the Kovar sheets each was 0.105 mm; and the thickness ($t_3$) of the outermost Al foils each was 0.006 mm.

The thus-obtained composite material had a thermal conductivity of 230 W/m.k in the direction of the thickness and had a thermal expansion coefficient of $8 \times 10^{-6}$/°C. in the respective main surfaces.

The composite material was cold-rolled into a thickness of 0.25 mm. In the thus-obtained heat-conductive composite material, the thickness ($t_1$) of the Cu sheet to constitute the core sheet was 0.110 mm; the thickness ($t_2$) of the Kovar sheets each was 0.067 mm; and the thickness ($t_3$) of the outermost Al foils each was 0.003 mm. Afterwards, the cold-rolled material was worked into a heat sink substrate by a known method. This was then formed into a semiconductive package, which had an excellent heat-releasability and also had an excellent glass-sealability.

While the invention has been described in detail and with reference to specific embodiments thereof, it will be apparent to one skilled in the art that various changes and modifications can be made therein without departing from the spirit and scope thereof.

What is claimed is:

1. A method of preparing a heat-conductive composite material comprising a core sheet which is composed of a metal sheet of high thermal expansion sandwiched between two metal sheets of low thermal expansion, each metal sheet of low thermal expansion having a number of through-holes in the direction of a thickness thereof, the three sheets being laminated and integrated so that a part of the metal sheet of high thermal expansion is exposed out to the metal surface of low thermal expansion through the though-holes of the metal sheets of low thermal expansion, and metal foil layers of high thermal expansion welded to opposite surfaces of the core sheet, the metal foil layers being the same as or different from the metal of high thermal expansion constituting the core sheet; the method comprising the steps of punching a number of through-holes in a pair of metal sheets of low thermal expansion in determined positions and in the thickness thereof, cleaning the facing surfaces of the metal sheets which are to be welded, sandwiching a metal sheet of high thermal expansion between the thus-punched and cleaned pair of metal sheets of low thermal expansion, and cold-rolling, warm-rolling or hot-rolling the three layers so as to integrate them to form a core sheet, and welding by cold-rolling, warm-rolling or hot-rolling the metal foils of high thermal expansion to opposite surfaces of the core sheet to form a five-layered composite material.

2. The method of preparing a heat-conductive composite material as claimed in claim 1, in which the core sheet formed by pressure-welding the metal sheets of low thermal expansion and the metal sheet of high thermal expansion is subjected to diffusive heat-treatment and/or the five layered composite material prepared by pressure-welding the metal foils of high thermal expansion to the core sheet is subjected to diffusive heat-treatment, for the purpose of improving the weldability of the respective layers.

3. The method of preparing a heat-conductive composite material as claimed in claim 2, in which the diffusive heat-treatment is effected under the condition of a temperature of from 750° C. to 950° C. and a period of time of from 2 minutes to 1 hour.

4. The method of preparing a heat-conductive composite material as claimed in claim 1, in which the through-holes to be formed in the metal sheets of low thermal expansion are so arranged that the hole pattern with the same dimension and the same shape is not repeated.

5. The method of preparing a heat-conductive composite material as claimed in claim 1, in which the through-holes to be formed in the metal sheets of low thermal expansion are so inclined that they do not conform to the thickness of the sheets.

6. The method of preparing a heat-conductive composite material as claimed in claim 1, in which the through-holes to be formed in the metal sheets of low thermal expansion are so tapered that the hole diameters differ from each other between the both surfaces of each sheet and they are so arranged that the hole diameters of the adjacent holes differ from each other.

7. The method of prepering a heat-conductive composite material as claimed in claim 1, in which the through-holes to be formed in the metal sheets of low thermal expansion have a cross section of a circular, oval or polygonal form and a longitudinal section of a straight or taper form.

8. The method of preparing a heat-conductive composite material as claimed in claim 1, in which various through-holes are formed in non-rolled metal sheets of low thermal expansion in the desired direction of the thickness thereof, or notches just before through-holes are formed therein, or various nothces with various shapes are formed in the both surfaces of the metal sheets in various directions.

9. The method of preparing a heat-conductive composite material as claimed in claim 1, in which the metal sheet of high thermal expansion of constituting the core sheet is made of anyone of Cu, Cu alloys, Al, Al alloys and steel.

10. The method of preparing a heat-conductive composite material as claimed in claim 1, in which the metal sheets of low thermal expansion of constituting the core sheet each are made of anyone of Mo, Ni—Fe alloys containing from 30 to 50 wt. % of Ni, Ni—Co—Fe alloys containing from 25 to 35 wt. % of Ni and from 4 to 20 wt. % of Co, and W.

11. The method of preparing a heat-conductive composite material as claimed in claim 1, in which the metal foils of high thermal expansion each are made of anyone of Cu, Cu alloys, Al, Al alloys, Ni and Ni alloys.

12. The method of preparing a heat-conductive composite material as claimed in claim 1, in which at least one main surface of the metal foils of high thermal expansion as welded to the both surfaces of the core sheet is Ni-plated in the determined position.

13. The method of preparing a heat-conductive composite material as claimed in claim 12, in which the Ni-plated material is then subjected to soaking treatment in an inert atmosphere or a reducing atmosphere under the condition of a temperature of from 750° C. to 950° C. and a period of time of from 1 min to 15 min.

14. A method of preparing a heat-conductive composite material comprising a core sheet which is composed of a metal sheet of high thermal expansion sandwiched between two metal sheets of low thermal expansion, each metal sheet of low thermal expansion having a number of through-holes in the direction of a thickness thereof, the three sheets being laminated and integrated so that a part of the metal sheet of high thermal expansion is exposed out to the metal surfaces of low thermal expansion through the through-holes of the metal sheets of low thermal expansion, and metal foil layers of high thermal expansion welded to opposite surfaces of the core sheet, the metal foil layers being the same as or different from the metal of high thermal expansion constituting the core sheet; the method comprising the steps of cleaning the metal sheet of high thermal expansion, the metal sheets of low thermal expansion and the metal foils of high thermal expansion, and then simultaneously welding by cold-rolling, warm-rolling or hot-rolling the five layers to form an integrated five-layered composite material.

* * * * *